(12) United States Patent
Yellin et al.

(10) Patent No.: US 8,788,918 B2
(45) Date of Patent: Jul. 22, 2014

(54) BLOCK ENCODING WITH A VARIABLE RATE BLOCK CODE

(75) Inventors: Daniel Yellin, Ra'anana (IL); Adoram Erell, Herzliya (IL); Shahar Fattal, Tel Aviv (IL)

(73) Assignee: Marvell World Trade Ltd., St. Michael (BB)

( * ) Notice: Subject to any disclaimer, the term of this patent is extended or adjusted under 35 U.S.C. 154(b) by 1042 days.

(21) Appl. No.: 12/365,565

(22) Filed: Feb. 4, 2009

(65) Prior Publication Data

US 2011/0065443 A1   Mar. 17, 2011

Related U.S. Application Data

(60) Provisional application No. 61/038,282, filed on Mar. 20, 2008, provisional application No. 61/038,942, filed on Mar. 24, 2008, provisional application No. 61/039,585, filed on Mar. 26, 2008.

(51) Int. Cl.
   *G06F 11/00* (2006.01)

(52) U.S. Cl.
   USPC .......................................... 714/790; 714/752

(58) Field of Classification Search
   None
   See application file for complete search history.

(56) References Cited

U.S. PATENT DOCUMENTS

| | | | | |
|---|---|---|---|---|
| 7,890,833 B2 * | 2/2011 | Xia et al. | | 714/752 |
| 2004/0193995 A1 * | 9/2004 | Park et al. | | 714/752 |
| 2008/0320373 A1 * | 12/2008 | Kim et al. | | 714/790 |
| 2009/0168904 A1 * | 7/2009 | Roh et al. | | 375/253 |
| 2009/0175361 A1 * | 7/2009 | Roh et al. | | 375/253 |
| 2010/0272209 A1 * | 10/2010 | Lee et al. | | 375/295 |
| 2011/0043391 A1 * | 2/2011 | Lee et al. | | 341/106 |
| 2013/0010879 A1 * | 1/2013 | Roh et al. | | 375/253 |

FOREIGN PATENT DOCUMENTS

| | | |
|---|---|---|
| CN | 1383622 A | 12/2002 |
| EP | 2 075 917 A1 | 7/2009 |
| GB | 2 412 553 A | 9/2005 |
| JP | 2005518136 A | 1/2004 |
| WO | WO 01/97394 A1 | 12/2001 |
| WO | WO-2007142476 A2 | 12/2007 |

OTHER PUBLICATIONS

International Search Report for Application No. PCT/IB2009/005085 (corresponding hereto) mailed Sep. 9, 2009; 4 pages.

(Continued)

*Primary Examiner* — Scott Baderman
*Assistant Examiner* — Jason Bryan (57) ABSTRACT

A control channel encoder includes a determiner configured to determine a current value of K for encoding control signals of a length M, wherein K is a function of a code rate for a data channel. A table generator is configured to, if K is greater than a predetermined threshold, generate a repeated matrix from a fixed block encoding matrix by variably repeating rows from said fixed block encoding matrix. A puncturer is configured to, if K is less than the predetermined threshold, puncture the fixed block encoding matrix to reduce a size of the fixed block encoding matrix. A block encoder is configured to utilize said repeated matrix, to encode M input control bits as K encoded control bits, by generating an encoded payload from said repeated matrix.

13 Claims, 4 Drawing Sheets

(56) References Cited

OTHER PUBLICATIONS

Ericsson; Agenda Item 6.1.4, "Summary of email discussion on UL control signaling" for Discussion and Decision; TSG-RAN WG1 #52, Sorrento, Italy, Feb. 11-15, 2008—R1-080871; 3rd Generation Partnership Project (3GPP), Mobile Competence Centre, Sophia-Antipolis Cedex, France; 2 pages.

LG Electronics; Agenda Item 6.2, "Erroneous transmission and reception of (32,X) linear block encoded information in PUSCH" for Discussion and Decision; 3GPP TSG RAN WG1 #55bis, Ljubljana, Slovenia, Jan. 12-16, 2008—R1-090200; 3rd Generation Partnership Project (3GPP), Mobile Competence Centre, Sophia-Antipolis Cedex, France; pp. 1-5.

LG Electronics; Agenda Item 6.1.4, "On the design of CQI coding in PUCCH" for Discussion and Decision; 3GPP TSG RAN WG1 #52, Sevilla, Spain, Jan. 14-18, 2008 —R1-080548; 3rd Generation Partnership Project (3GPP), Mobile Competence Centre, Sophia-Antipolis Cedex, France; pp. 1-5.

Marvell; Agenda Item 6.2, "Variable-length Block Code for CQI Report on PUSCH" for Decision; 3GPP TSG RAN WG1 #52bis, Shenzhen, China, Mar. 31-Apr. 4, 2008—R1-081271; 3rd Generation Partnership Project (3GPP), Mobile Competence Centre, Sophia-Antipolis Cedex, France; pp. 1-6.

"Draft CR to 36.212 Incorporating Decisions from RAN1#51bis and RAN1#52." R1-081157 Version 8.1.0, 3GPP TSG-WG1 #52 (Sorrento, Italy Feb. 11-15, 2008): 35 pages.

"Draft Report of 3GPP TSG Ran WG1 #52v.0.1.0 (Sorrento, Italy, Feb. 11-15, 2008)." 3GPP TSG RAN WG1 Meeting #52bis (Shenzhen, China Mar. 31-Apr. 4, 2008): 65 pages.

"Notes from Uplink Control Signaling Discussions" TSG-RAn WG1#50, R1-073842 (Athens, Greece, Aug. 20-24, 2007) 1 page.

3GPP TS 25.212 V8.1.0 (Mar. 2008); 3rd Generation Partnership Project; Technical Specification Group Radio Access Network; Multiplexing and channel coding (FDD) (Release 8); 103 pages.

3GPP TS 36.212 V9.0.0 (Dec. 2009); 3rd Generation Partnership Project; Technical Specification Group Radio Access Network; Multiplexing and channel coding (FDD) (Release 9); 61 pages.

R1-073896; 3GPP TSG RAN WG1 Meeting #50b; Shanghai, China; Oct. 8-12, 2007; 59 pages.

R1-074333 (R1-073654); 3GPP TSG RAN WG1 Meeting #50bis; Scheduling Request Supporting High Doppler; Nokia Siemens Networks, Nokia; Shanghai, China; Oct. 8-12, 2007; 6 pages.

R1-081098; 3GPP TSG RAN WG1 #52; Coding for CQI Moved From PUCCH to PUSCH; LG Electronics; Sorrento, Italy; Feb. 11-15, 2008; 3 pages.

R1-081158; 3GPP TSG-RAN WG1 Meeting #52; Sorrento, Italy; Feb. 11-15, 2008; 29 pages.

Communication dated Jun. 26, 2012 enclosing Office Action received for European Patent Application 097255780; 7 pages.

Sklar, Bernard, and Fredric J. Harris. "The ABCs of Linear Block Codes." IEEE Signal Processing Magazine Jul., 2004: pp. 14-35.

Summary of Notice of Reasons for Rejection for Japanese Application No. 2011-501314, mailed Jul. 30, 2013, 2 pages.

Notification of Second Office Action for Chinese Application No. 200980110744.6 mailed Jul. 16, 2013, 13 pages.

Motorola, CQI Coding Schemes, 3GPP R1-080096, Jan. 18, 2008, 4 pages.

Motorola, Multiplexing of ACK/NACK and Data for UL, 3GPP R1-074014, Oct. 12, 2007, 2 pages.

Qualcomm Europe, Link Analysis of DL Scheduleing Related Overhead in UL, 3GPPR1-060952, Mar. 31, 2006, 5 pages.

\* cited by examiner

BLOCK ENCODING WITH A VARIABLE RATE BLOCK CODE

CROSS-REFERENCE TO RELATED APPLICATIONS

This application claims benefit from U.S. Provisional Patent Applications 61/038,282, filed Mar. 20, 2008, 61/038,942, filed Mar. 24, 2008, and 61/039,585, filed Mar. 26, 2008 which are hereby incorporated in their entirety by reference.

FIELD OF THE INVENTION

The present invention relates to channel quality indication generally and to such indication in LTE (Long Term Evolution) of the 3GPP (3rd Generation Partnership Project) radio-access network standard (officially known as E-UTRA) systems in particular.

BACKGROUND

Figure 1:
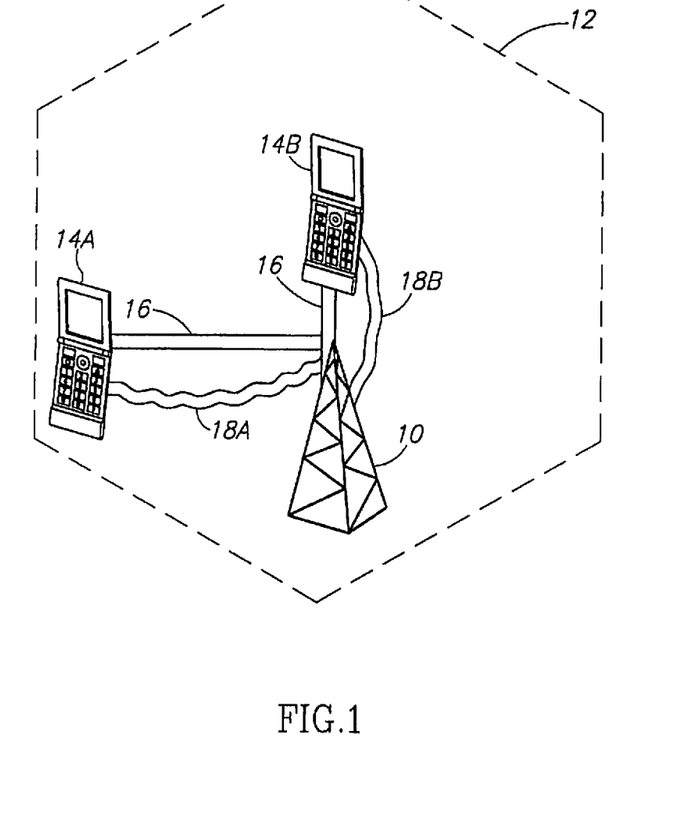
FIG. 1 is a schematic illustration of a base station, two mobile units and two of the channels therebetween.

The Third Generation Partnership Project ("3GPP") is in the process of defining various communication protocols necessary for an evolving 3GPP cellular network standard, nicknamed "LTE". As shown in FIG. 1, to which reference is now made, two operation channels, among many, have been defined for the uplink (i.e., the link where a mobile unit 14, dubbed "user equipment" or UE in the LTE standard, transmits to its serving base station 10, or eNodeB in the LTE standard). One channel is a physical uplink channel for data 18, called the PUSCH, and the other channel is a physical uplink channel for control 16, called the PUCCH. Both data and control signals may pass on data channel 18, but control channel 16 is reserved for control signals only and is designed to work from the farthest reaches of each cell 12 (i.e. from the furthest possible distances from each base station 10) and under very poor conditions.

Many different signals have been defined. One is a CQI (channel quality indicator) report with which each UE 14 informs its serving base station 10 of the quality of the downlink channel, i.e. of the propagation channel from base 10 to UE 14. Conventionally, the CQI report may be sent on the uplink control channel, PUCCH.

In the context of emerging LTE standards, it has been recently suggested that control reports (such as the CQI reports) may be sent on the data channel. However, the structure of control reports intended for the control channel cannot be readily copied to the data channel because the two channels operate differently.

SUMMARY

There is provided, in accordance with an embodiment, a method for a user equipment device of a cellular communications system including block encoding a control signal with a variable rate block code whose coding rate generally matches a variable coding rate of a data channel upon which the report is to be transmitted.

There is also provided, in accordance with an embodiment, a method for a user equipment device of a cellular communications system. The method includes transmitting and receiving signals via both a data and a control channel, and encoding control signals using a coding scheme having a first coding rate to achieve a target BLER (block error rate) that approximates a target BLER used for transmitting control signals on the control channel. The control signals are to be transmitted over at least the data channel along with data that is encoded using an encoding scheme having a second coding rate to achieve a target BLER for data that is different than the BLER for transmitting control signals on the control channel.

Moreover, in accordance with an embodiment, the device is an LTE compliant device.

Further, in accordance with an embodiment, the coding rate of the variable rate block code is proportional to the coding rate of the data channel.

Additionally, in accordance with an embodiment, the encoding includes determining an output encoding length K as a function of a current code rate of the data channel, repeating a block encoding matrix to provide it with at least K rows and generating an encoded control signal on the data channel from the input control signal using the first K rows of the repeated block encoding matrix.

Moreover, in accordance with an embodiment, the encoding includes encoding with a cyclically repeated block code.

Still further, in accordance with an embodiment, the encoding includes encoding a CQI (channel quality indicator) report. In one embodiment, it is a short CQI report.

Moreover, in accordance with an embodiment, the method also includes puncturing the block encoding matrix when K is less than the number of rows in the block encoding matrix.

Further, in accordance with a preferred embodiment of the present invention, the repeating includes repeating the block code to match a convolutional code rate, further repeating of the block code until a desired code rate is surpassed and rate matching the convolutional code rate with the block encoded matrix generated by the further repeating.

There is provided, in accordance with an embodiment, a communications device including a block encoder to encode a control signal with a variable rate block code whose coding rate generally matches a variable coding rate of a data channel upon which the report is to be transmitted.

There is also provided, in accordance with an embodiment, a communications device including a transceiver to transmit and receive signals via both a data and a control channel, and a control channel encoder to encode control signals using a coding scheme having a first coding rate to achieve a target BLER (block error rate) used for transmitting control signals on the control channel. The control signals are to be transmitted over the data channel along with data that is encoded using an encoding scheme having a second coding rate to achieve a target BLER for data that is different than the BLER used for transmitting control signals on the control channel.

There is also provided, in accordance with an embodiment, a control channel encoder including a determiner, a table generator and a block encoder. The determiner determines a current value of K for encoding control signals of a length M, wherein K is a function of a current code rate for the data channel. The table generator generates a variable length, block encoding matrix from a fixed block encoding matrix by repeating rows from the fixed block encoding matrix to produce a repeated matrix of variable length K and the block encoder encodes M input control bits with the variable length, block encoding matrix as K encoded control bits.

Moreover, in accordance with an embodiment, the device and encoder are implemented in an LTE compliant communications system.

Further, in accordance with an embodiment, the coding rate of the variable rate block code is proportional to the coding rate of the data channel.

Still further, in accordance with an embodiment, the encoder also includes a puncturer to puncture the block encoding matrix when K is less than the number of rows in the block code matrix.

Finally, in accordance with an embodiment, the table generator includes a repeater to repeat the block code matrix a first time to match a convolutional code rate and additional times until a desired code rate is surpassed and a rate matcher to match the convolutional code rate with the multiply repeated block encoded matrix.

BRIEF DESCRIPTION OF THE DRAWINGS

Embodiments of the invention will be described with reference to the following drawings, in which like numerals designate like elements and wherein.

It is noted that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of teaching principles of the described embodiments. However, it is noted that the present invention may be practiced without some of these specific details.

FIG. 1 illustrates the problem of sending control reports on data channel 18. Base station 10 is located in a cell 12. Mobile units, such as UEs 14, may move throughout cell 12 and may communicate with base station 10. As can be seen, UE 14A is located near the edge of cell 12 while UE 14B is located near base station 10. Various parameters, including, for example, the distance between UEs 14 and base 10, as well as the nature of the terrain and the speed of each UE 14 relative to base 10, affect the quality of the radio-propagation channel (or simply the "radio channel").

Each UE 14 transmits and receives various types of information, including control and data, which are sent on physical control channel 16 and physical data channel 18, respectively. Since control signals must be received correctly, promptly, and at a well-defined time (e.g. upon transmission) in order for the system to operate properly, each control channel 16 is depicted with firm lines, indicating that the control channel transmission scheme is defined such that the target block error rate (BLER) is as low as a few percent, even for UE's 14 with poor radio-channel conditions, such as UE 14A. It is noted that because of its greater distance from base 10, as seen in FIG. 1, UE 14A may suffer from poor radio-channel conditions in comparison to UE 14B. Nevertheless control signals from both UE 14A and UE 14B must be properly received despite the respective differences in channel conditions.

Physical data channels 18 operate differently, however. Accordingly, data channels 18 are shown with wavy lines, indicating that the quality of the channel may vary over time. Data channels are not necessarily required to be received promptly and at a well defined time. Instead, they may employ techniques such as retransmission and incremental redundancy to optimize data carrying capacity and ensure proper reception of the data. Therefore the target maximum BLER for any single transmission on the data channel may be set higher than for the control channel, typically at 10 to 30 percent.

In addition, in accordance with an embodiment, the transmission parameters and error-protection scheme of physical data channels 18 may vary dynamically as a function of the quality of the instantaneous radio-propagation channel. This is called "link-adaptation". In contrast, physical control channels 16 generally do not have link adaptation. Accordingly, control channels 16, which typically are configured to carry less information than data channels 18, are designed to have significantly stronger error protection, e.g. stronger forward error correction, than data channels 18.

In accordance with some mobile communications standards, control channels 16 and data channels 18 do not transmit at the same time. Selected subframes of a transmission cycle may be allocated to control channels 16 while other subframes of the cycle may be allocated to data channels 18. Base station 10 may request a CQI (channel quality indicator) report at various subframes and may allocate either control or data channels for the report. Data channel 18 may carry a variable number of bits, from a minimum of 240 to thousands. Control channel 16 may carry a small number of bits which may be fixed for any given type of cell. For example, for small cells, the number of bits may be fixed to 20. Accordingly, the CQI report that is transmitted on control channels 16 is relatively small, and is meant for subframes with no allocation of data channels.

In accordance with current 3GPP standards for LTE compliant communications, the error protection scheme for the CQI report on control channels 16 is of an "algebraic block coding" type, which uses an N×M generator matrix RM, of a generalized Reed-Muller type of coding. To generate a vector O of N output bits, the N×M matrix RM is binary-multiplied by an input payload vector I of length M. Thus, O=RM*I. The resultant block code has a codeword length N and is relatively efficient for a smaller CQI payload, such as where M is 10 bits or less. In accordance with current 3GPP standards for LTE compliant communications, N is 20 and the code is called "RM20". While there may be a variable number of input (information) bits in vector I, typically 4-11 (and for large cells, it may be 4-14), the number of output (encoded) bits is fixed to N.

On top of the RM20 code, the modulation scheme for control channel 16 employs "spreading" (i.e. modulating multiple resource elements by a single bit, resulting in signal gain), such that there is roughly a 10 dB gain in transmitting the N coded bits over a similar transmission in a non-spread scheme. With the combination of coding and spreading, the resulting link quality of the control channel 16 works sufficiently well for UEs near a cell edge, such as UE 14A. Another aspect of the spreading is that it enables code-multiplexing of up to 6 UEs transmitting simultaneously and on the same frequency band without mutual interference.

In accordance with an embodiment, CQI reports may be transmitted on data channels 18. Base station 10 may request a larger (and more detailed) CQI report from a selected UE 14 by allocating an uplink transmission for this purpose on the data channel 18 associated with the selected UE 14. This may happen either with or without an accompanying allocation to also transmit data on the data channel 18. In accordance with an embodiment, if data is also to be transmitted, both the large-CQI report and the data are first independently encoded with their own error-protection codes (the target error rate of the CQI is typically much smaller than that of the data, so the same code would not be used for both), after which the report and data are multiplexed and transmitted together on the PUSCH data channel 18.

In another scenario, a UE 14 may periodically transmit a small CQI report on control channel 16. Base station 10 may dynamically or periodically grant a data channel 18 to UE 14 for the transmission of data. It might, therefore, occasionally happen that both the data channel 18 and control channel 16 need to be transmitted simultaneously. Because LTE does not permit such simultaneous transmissions, the CQI report may be transmitted "piggyback" on the data channel 18 along with the other data.

Another scenario is that of a requested small-CQI report on the data channel 18, where this requested CQI report has the same size-range as that of the piggybacked CQI, although it might have a different content.

In accordance with an embodiment, the error protection scheme of the small CQI reports on the data channel 18 may be handled in a uniform manner, whether specifically requested on the data channel 18 or piggybacked from the control channel 16. In this embodiment, the CQI report and other control signals carried on data channels 18 may have a level of error protection that is commensurate with the error protection available on the control channel 16, despite the lower protection usually provided on data channels 18 (as indicated in FIG. 1). Additionally, such reports when transmitted on data channels 18 may be provided a spreading gain similar to that of control channels 16, to ensure that reports from cell-edge UEs 14, such as UE, 14B will be received properly.

In this embodiment, in accordance with current 3GPP standards for LTE compliant communications, control bits sent on data channels 18 may follow a link adaptation similar to that of the data. For example, one characteristic of the variable transmission parameters of data channels 18 is a variable coding-rate. For block encoding, the coding rate is given by the ratio M/N. The lower the coding rate, the more protection. For example, if the number of input bits is M=10 and the code length is N=20, the coding rate is ½. If, for the same number of input bits, M=10, the code length is N=32, the coding rate is 10/32 or about ⅓, which provides stronger error protection than a coding rate of ½.

Finally, in this embodiment, the repetition of code information may provide a spreading operation, which may, effectively, provide a power gain.

In accordance with an embodiment, a short CQI report on the data channel 18 may have an adaptable error protection level which may be configured to enable the transmission of the CQI report together with data at various link conditions and with different code rates as needed. Other LTE encoding and decoding schemes may be used and the number of coded CQI bits on data channels 18 may be configured to be no more than the minimum required for proper reception. In this manner, the efficiency of the accompanying data transmission on the data channel 18 may be generally optimized.

Figure 2A:
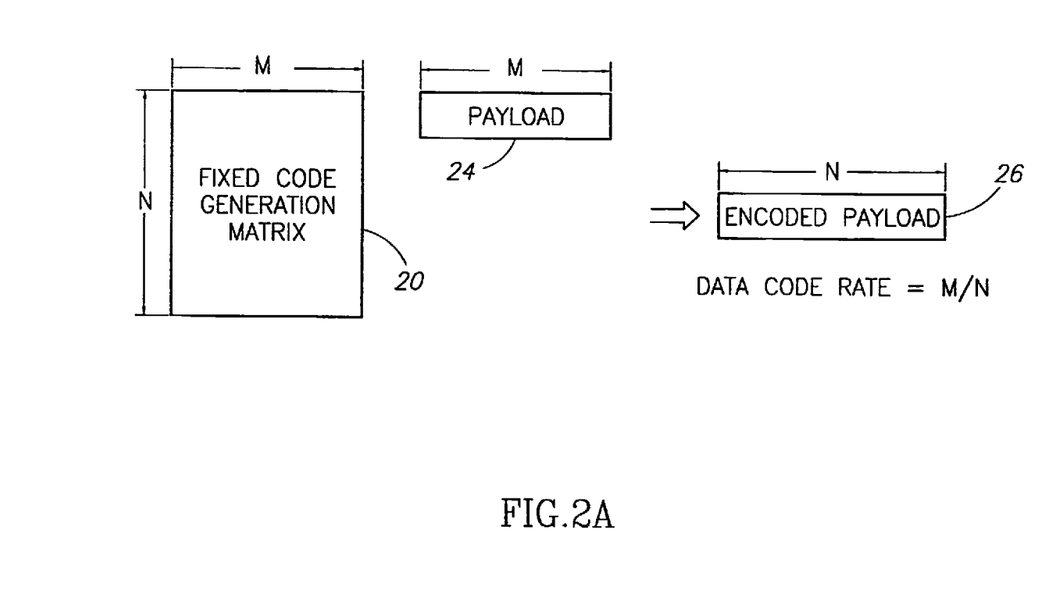
FIGS. 2A and 2B together are schematic illustrations that illustrate a variably repeating block code suitable for encoding M input control signals, constructed and operative in accordance with an embodiment of the present invention.
Figure 2B:
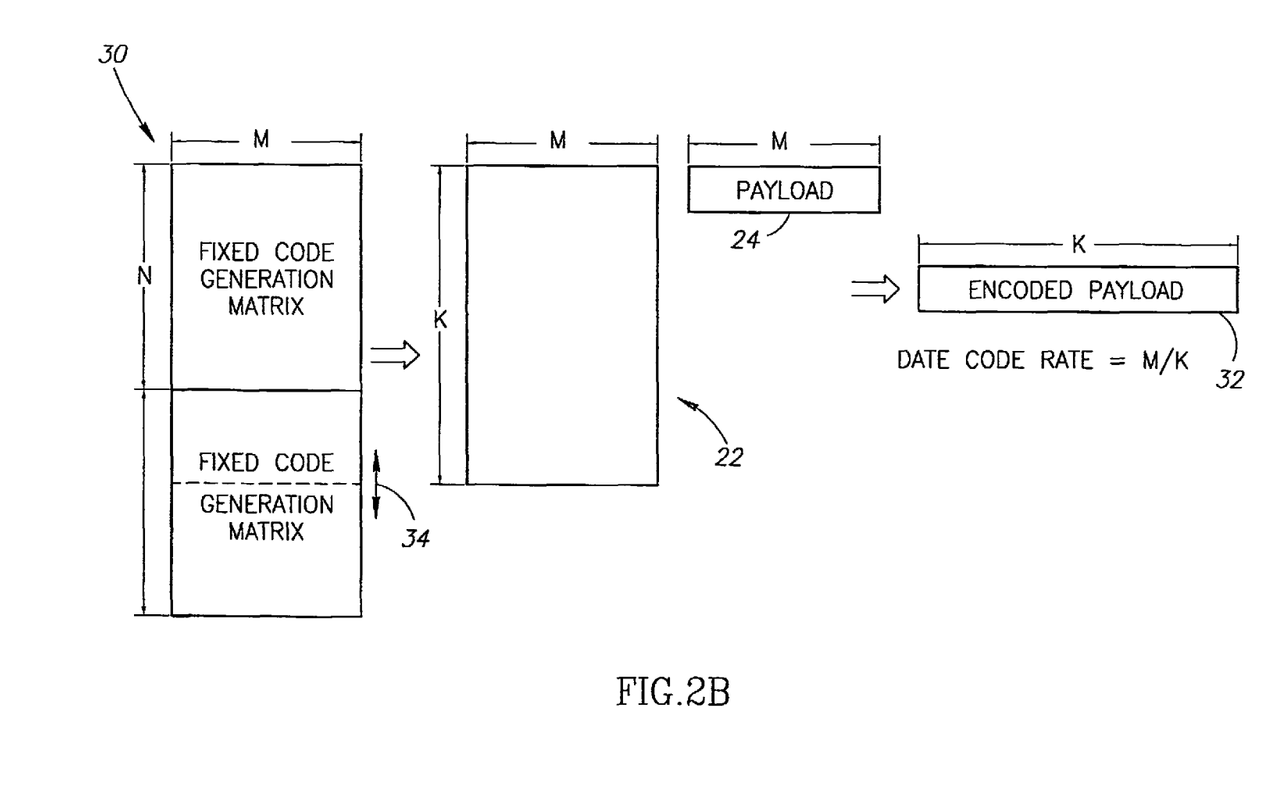

Reference is now made to FIGS. 2A and 2B, which, together, illustrate a variably repeating block code suitable for encoding M input control signals, such as the short CQI report, to generate K output bits whose code rate approximately matches that of the variable code rate on data channel 18. FIG. 2A illustrates a fixed block code matrix 20 and FIG. 2B illustrates a variable length, block code matrix 22 that may be generated from fixed block code matrix 20.

As seen in FIG. 2A, a payload 24 of length M may be encoded using N×M matrix 20, by multiplying the N×M matrix by the payload. This may produce an encoded payload 26 of length N. The data code rate for encoded payload 26 is M/N. For a short CQI report of M=10 and N=20 (the common sizes for the short CQI report on control channel 16), the data rate is ½. In accordance with an embodiment, fixed block code matrix 20 may be utilized for data rates of ½ for reports of length of M=9-11.

In accordance with an embodiment, variable length, block code matrix 22 as depicted in FIG. 2B may be utilized to generate encoded payload 32 for other data rates. Matrix 22 may be generated from fixed matrix 20 by first repeating fixed matrix 20, to create a repeated matrix 30. FIG. 2B shows two repetitions of block code 20; more repetitions may be used, if necessary. A partial repetition may also be used, such that repeated matrix 30 may alternatively comprise, for example, 2.5 or 3.5 repetitions of block code 20. The current variable length, block code matrix 22 may then be generated by selecting the first K rows of repeated matrix 30, where K is the value needed to create the current data rate, given the input vector length M. K may therefore be variable in size and may correspond to a number of rows in at least one or more whole matrixes 20 plus a fractional matrix 20 when relevant. The current, variable length, block code matrix 22 may then multiply input payload 24, generating an encoded payload 32 of length K.

For example, for M=10 as in the previous embodiment, if the current data rate is ⅓, then K may be set to about 30 and encoded payload 32 may be 30 bits long. If the current data rate is ¼, then K may be set to about 40 and encoded payload 32 may be 40 bits long. It is noted that K may not always be a multiple of M. For example, for a current data rate of 0.40, M may be 10 and K may be set to 25. In such a case, repeated matrix 30 may comprise 2.5 repetitions of fixed matrix 20, and some, but not all, rows of partial fixed block code matrix 20 may also be included in repeated matrix 30.

Fixed block code matrix 20 may be any suitable, relatively short block code matrix. For example, current 3GPP standards for LTE compliant communications include definitions of the RM20 block code, used for control channels 16. An RM32 block code has also been proposed for use with data channel 18. Either of these may be suitable for fixed block code matrix 20.

The current value for length K may be determined from the current data coding-rate, in accordance with current 3GPP standards for LTE compliant communications, as follows:

$$K = \left\lceil \frac{M}{Q_m R} \cdot 10^{-\frac{\Delta_{offset}^{PUSCH}}{10}} \right\rceil \quad \text{Equation 1}$$

where delta is an offset, R is the current data coding-rate and $Q_m$ is the current data modulation order, and where delta, R and $Q_m$ are part of the transmission parameters for the current data channel 18. Thus, the block coding rate K/M may be proportional to the data coding rate R. In equation 1, the proportionality is a function of delta and $Q_m$.

Figure 3:
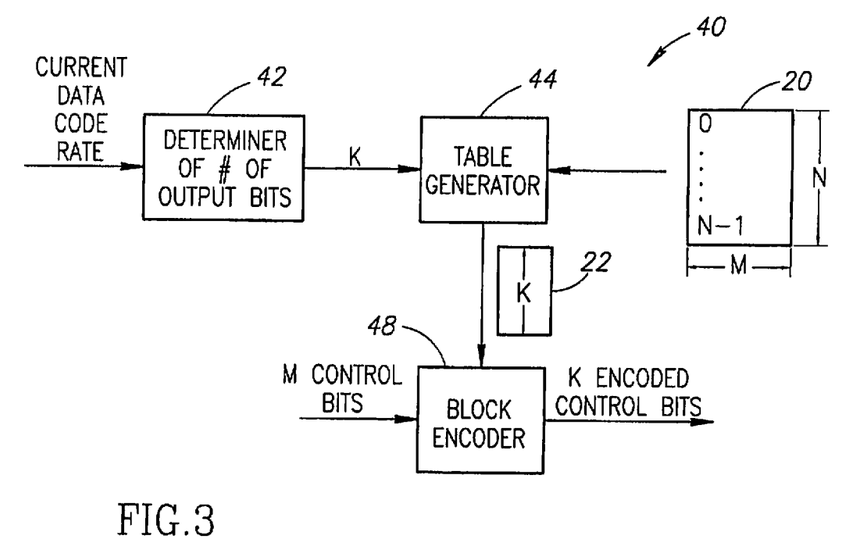
FIG. 3 is a block diagram illustration of a control channel encoder, useful for generating the block code of FIGS. 2A and 2B.

Reference is now made to FIG. 3, which illustrates a control channel encoder 40, constructed and operative in accordance with an embodiment of the present invention, forming part of each UE 14 (FIG. 1). Encoder 40 may comprise a determiner 42, a table generator 44, and a block encoder 48, coupled together as shown.

Determiner 42 may determine the current value of K currently needed for encoding control signals of length M. As discussed hereinabove, the number K may be a function of the code rate for the data channel 18 over which UE 14 may transmit data. At any given time, base station 10 (FIG. 1) may inform UE 14 of the current transmission format, which format includes a code rate for its data channel 18. As discussed hereinabove, the code rate is typically a function of channel conditions. In accordance with an embodiment, the control signals being sent on data channel 18 should have a code rate which matches, up to an offset (such as the offset delta in equation 1), the code rate of the data bits sent simultaneously on data channel 18. Determiner 22 may determine the number K of output bits according to equation 1.

Table generator 44 may generate variable length, block code matrix 22 from fixed block code matrix 20 by repeating the rows of fixed matrix 20, producing repeated matrix 30. It is noted that, as described hereinabove, the value of K may determine whether or not some of the rows of a partial block code matrix 20 may be included in repeated matrix 30. Table generator 44 may then select the first K rows of repeated matrix 30, thereby to generate the current version of variable length, block code matrix 22.

As mentioned hereinabove, the number K of output bits may vary, as indicated by double-headed arrow 34 of FIG. 2B. As known in the art, the ratio K/N approximately equals the coding-gain achieved over operation just with fixed block code matrix 20. It is noted that repetition of the rows has approximately the same effect as the repetition caused by the spreading. Accordingly when the value of K/N is close or equal to the value of the following:

$$BCL_d/BCL_c * CSG_c \qquad \text{Equation 2}$$

(where $BCL_d$ is the data channel block code length, $BCL_c$ is the control channel block code length, and $CSG_c$ is the control channel spreading gain), then the target BLER of the CQI bits on data channel 18 will be close or equal to that of control channel 16.

Block encoder 48 may then utilize variable length block code 22 to encode the M input control bits as K encoded control bits. Block encoder 48 may operate whenever there are control bits to be sent on data channel 18 or only when there is a small control report, such as the small CQI report, or at any suitable time when UE 14 may transmit control bits that are encoded with a Reed-Muller codeword.

Figure 4:
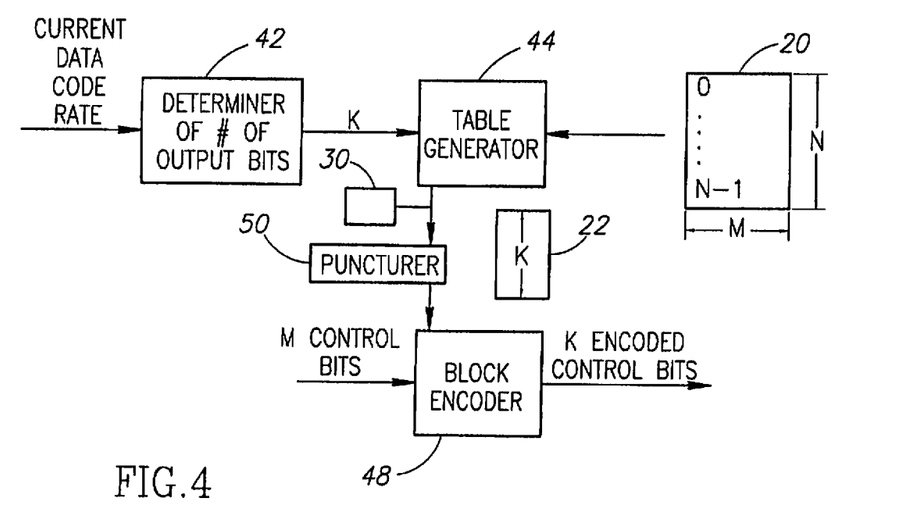
FIG. 4 is a block diagram of an alternative embodiment of the encoder of FIG. 2.

In accordance with another embodiment, as seen in FIG. 4, to which reference is now made, table generator 44 may "puncture" repeated table 30 using any suitable puncturing scheme. In this embodiment, table generator 44 may repeat fixed block code matrix 20 a number J of times and block encoder 48 may generate encoded payload 32 from repeated matrix 30. The resultant code rate (the ratio of M/J) may be lower than required and thus, block encoder 48 may puncture encoded payload 32, as described in more detail hereinbelow, thereby reducing J to J', until M/J' approximately matches the desired code-rate. It will be appreciated that both J and J' may be either whole numbers or fractions, depending on whether or not a partial fixed block code matrix may be included in repeated matrix 30.

In one embodiment, fixed block code matrix 20 may be an RM32 block code matrix, where N is 32. When K>32, table generator 44 may cyclically repeat the RM32 matrix to form repeated matrix 30 as described hereinabove. However, for K<32, table generator 44 may send fixed block code matrix 20 to a puncturer 50, to reduce the size of matrix 20.

Puncturer 50 may perform any suitable puncturing operation. For example, and in accordance with current 3GPP standards for LTE compliant communications, the RM32 matrix may be truncated until it has only the first K rows in it.

In another embodiment, puncturer 50 may be designed by first looking for an optimal puncturing pattern, optimizing over all payload sizes, and over all nested puncturing patterns (where "nested" means that once a row "j" is erased to produce a matrix of length N−1, then, to obtain a matrix of length N−2, a different row "k" is erased).

In a further embodiment, puncturer 50 may puncture all the excess tailing bits of the repeated-codeword block.

In a still further embodiment, table generator 44 may be designed to match the operation of the convolutional coder used for the large CQI reports on data channel 18. The latter scheme may operate on blocks whose length is an integer multiple of 3 (because the convolutional code has a rate of ⅓). Accordingly, in this embodiment, table generator 44 may first repeat fixed block code matrix 20 three times, to generate a first repeated table 30. Table generator 44 may then repeat first repeated table 30, L times (L can be also 1) until the desired code-rate is surpassed, thus regenerating repeated table 30. Then the rate-matching of the convolutional code may operate on the output of block encoder 48 until the desired code-rate is obtained.

An alternative to the above repetition is to perform the above-mentioned convolutional coding and rate-matching on the output of the block encoder 48.

Embodiments of the present invention may include apparatus for performing the operations herein. This apparatus may be specially constructed for the desired purposes, such as an ASIC for use in an LTE compliant UE, or it may comprise a general-purpose computer selectively activated or reconfigured by a computer program stored in the computer. Such a computer program may be stored in a computer readable storage medium, which may be any type of media suitable for storing electronic instructions and capable of being coupled to a computer system bus.

While certain features of the disclosure have been illustrated and described herein, various modifications, substitutions, changes, and equivalents may occur to those of ordinary skill in the art without departing from the scope of the invention as claimed hereinbelow.

What is claimed is:

1. A control channel encoder comprising:
    a determiner configured to determine a current value of K for encoding control signals of a length M, wherein K is a function of a code rate for a data channel;
    a table generator configured to, if K is greater than a predetermined threshold, i) generate a repeated matrix from a fixed block encoding matrix by variably repeating rows from said fixed block encoding matrix and variably repeating said fixed block encoding matrix three times, and ii) repeat the repeated matrix L times based on a desired code rate;
    a puncturer configured to, if K is less than the predetermined threshold, puncture the fixed block encoding matrix to reduce a size of the fixed block encoding matrix; and
    a block encoder configured to utilize said repeated matrix, to encode M input control bits as K encoded control bits, by generating an encoded payload from said repeated matrix.

2. The control channel encoder according to claim 1, wherein the control channel encoder is implemented in an LTE compliant communications system.

3. The control channel encoder according to claim 1, wherein the repeated matrix uses a cyclically repeated block code.

4. The control channel encoder according to claim 1, wherein the M input control bits define a channel quality indicator report.

5. The control channel encoder according to claim 1, wherein the M input control bits define a short channel quality indicator report.

6. A method of operating a control channel encoder, the method comprising:
  determining a current value of K for encoding control signals of a length M, wherein K is a function of a code rate for a data channel;
  based on the determining,
    if K is greater than a predetermined threshold, i) generating a repeated matrix from a fixed block encoding matrix by variably repeating rows from the fixed block encoding matrix and variably repeating said fixed block encoding matrix three times to produce a repeated matrix, and ii) repeat the repeated matrix L times based on a desired code rate, and
    if K is less than the predetermined threshold, puncturing the fixed block encoding matrix to reduce a size of the fixed block encoding matrix; and
  utilizing the repeated matrix to encode M input control bits as K encoded control bits by generating an encoded payload from the repeated matrix.

7. The method according to claim 6, further comprising implementing the encoder in an LTE compliant communications system.

8. The method according to claim 6, wherein the repeated matrix uses a cyclically repeated block code.

9. The method according to claim 6, further comprising defining a channel quality indicator report using the M input control bits.

10. The method according to claim 6, further comprising defining a short channel quality indicator using the M input control bits.

11. The control channel encoder according to claim 1, wherein the block encoder is further configured puncture the encoded payload based on a desired code rate.

12. The method according to claim 7, wherein puncturing the encoded payload includes puncturing the encoded payload based on a desired code rate.

13. The control channel encoder of claim 1, wherein the puncturer is further configured to select an optimal puncturing pattern based on a plurality of payload sizes and a plurality of puncturing patterns.

* * * * *